United States Patent [19]
Bajorek et al.

[11] Patent Number: 5,465,186
[45] Date of Patent: Nov. 7, 1995

[54] SHORTED MAGNETORESISTIVE HEAD LEADS FOR ELECTRICAL OVERSTRESS AND ELECTROSTATIC DISCHARGE PROTECTION DURING MANUFACTURE OF A MAGNETIC STORAGE SYSTEM

[75] Inventors: Christopher H. Bajorek, Los Gatos; A. David Erpelding, San Jose; Glen A. Garfunkel, Los Gatos; Surya Pattanaik, San Jose; Neil L. Robertson, Campbell; Albert J. Wallash, Morgan Hill, all of Calif.

[73] Assignee: International Business Machines Corporation, Armonk, N.Y.

[21] Appl. No.: 187,881

[22] Filed: Jan. 26, 1994

[51] Int. Cl.$^6$ ........................................... G11B 5/33
[52] U.S. Cl. ................................. 360/113; 29/603
[58] Field of Search ........................ 360/113, 137; 29/603

[56] References Cited

U.S. PATENT DOCUMENTS

| | | | |
|---|---|---|---|
| 4,317,149 | 2/1982 | Elser et al. | 360/126 |
| 4,761,699 | 8/1988 | Ainslie et al. | 360/103 |
| 4,786,993 | 11/1988 | Jove et al. | 360/113 |
| 4,800,454 | 1/1989 | Schwarz et al. | 360/103 |
| 4,841,395 | 6/1989 | Craft | 360/103 |
| 4,987,514 | 1/1991 | Gailbreath et al. | 361/220 |
| 4,996,623 | 2/1991 | Erpelding et al. | 360/104 |
| 5,270,645 | 12/1993 | Wheeler et al. | 324/207 |
| 5,361,547 | 11/1994 | Church et al. | 29/603 |

FOREIGN PATENT DOCUMENTS

0457278A2  5/1991  Germany ................ G11B 5/39

*Primary Examiner*—Robert S. Tupper
*Attorney, Agent, or Firm*—Leslie G. Murray

[57] ABSTRACT

The magnetoresistive (MR) sensor in a magnetic read/write transducer is protected against the effects of electrical overstress and electrostatic discharge during the manufacture and assembly of a magnetic storage system. The conductive leads of a magnetoresistive (MR) sensor element are shorted together to provide a low resistance, conductive path bypassing the MR element and minimizing electrical current through the MR sensing element during discharge of static electrical charge. The MR sensor lead terminal pads provided on the transducer/slider surface are shorted together by soldering. The other transducer elements such as the MR magnetic shields, the inductive coil and the inductive magnetic yoke structure can also be shorted to the MR sensor leads by soldering together the lead terminal pads at the slider surface. Alternatively, a twisted conductor pair may be used to short the MR terminals together. Remotely located protective devices, such as reversed diode pairs, can also be connected across the MR sensor element utilizing the twisted pair. The short is removed prior to placing the MR head into operation in the magnetic storage system.

37 Claims, 6 Drawing Sheets

SHORTED MAGNETORESISTIVE HEAD LEADS FOR ELECTRICAL OVERSTRESS AND ELECTROSTATIC DISCHARGE PROTECTION DURING MANUFACTURE OF A MAGNETIC STORAGE SYSTEM

BACKGROUND OF THE INVENTION

The present invention relates generally to electrical protection circuitry for magnetic disk drives and more particularly to such circuitry to protect against electrostatic discharge or electrical overstress in read/write transducers utilizing magnetoresistive read sensors.

Magnetic head disk drive systems have been widely accepted in the computer industry as a cost effective form of data storage. In a magnetic disk drive system a magnetic recording medium, in the form of a disk, rotates at high speed while a magnetic read/write transducer, referred to as a magnetic head, "flies" slightly above the surface of the rotating disk. The magnetic disk is rotated by means of a spindle drive motor. The magnetic head is attached to or formed integrally with a "slider" which is suspended over the disk by a spring-loaded suspension attached to a support arm known as the actuator arm. As the magnetic disk rotates at operating speed the moving air generated by the rotating disk in conjunction with the physical design of the slider operate to lift the magnetic head allowing it to glide or fly slightly above and over the disk surface on a cushion of air, referred to as an air bearing. The flying height of the magnetic head over the disk surface is typically only a few microinches or less and is primarily a function of disk rotation speed, the aerodynamic properties of the slider assembly and the force exerted by the spring-loaded actuator arm.

A major problem that is encountered during manufacture, handling and use of magnetic recording transducers, referred to as heads, is the buildup of electrostatic charges on the various elements of a head or other objects which come into contact with the heads, particular heads of the thin film type, and the accompanying spurious discharge of the static electricity thus generated. Static charges may be produced by the presence of certain materials, such as plastics, during manufacture and subsequent handling of the heads, for example. These static charges arc across the edge of the insulating layer between the magnetic pole tips and adjacent conductive layers which are exposed and positioned adjacent to the transducing gap at the air bearing surface facing the recording medium thus causing erosion of the pole tips and degradation of the transducer in reading and writing of data.

The above-described electrostatic discharge (ESD) problems associated with thin film inductive read/write heads are well-documented and several solutions have been proposed. U.S. Pat. No. 4,317,149 issued to Elser et al discloses an inductive head having short discharge paths formed by the deposition of conductive material in the recesses formed in an insulating layer so that the static electric discharge will occur in areas displaced from the critical pole tip and gap area at the slider air bearing surface. U.S. Pat. No. 4,800,454 issued to Schwarz et al discloses an inductive head assembly wherein the magnetic pole piece and the inductive winding is coupled to the slider body to allow discharge of any static electric charges which may build up. The winding is connected to the slider body via a diode with high forward and reverse voltage drops, or through a fusible link.

Magnetoresistive (MR) sensors are well known and are particularly useful as read elements in magnetic transducers, especially at high recording densities. The MR read sensor provides a higher output signal than an inductive read head. This higher output signal results in a higher signal to noise ratio for the recording channel and thus allows greater areal density of recorded data on a magnetic disk surface to be achieved. As described above, when an MR sensor is exposed to ESD, or even a voltage or current input larger than that intended under normal operating conditions, referred to as electrical overstress or EOS, the MR read sensor and other parts of the head may be damaged. This sensitivity to electrical damage is particularly severe for MR read sensors because of these sensors' relatively small physical size. For example, an MR sensor used for extremely high recording densities will have a cross-section of 100 Angstroms (A) by 1.0 micrometers (um) or smaller. Accidental discharge of voltages of only a few volts through such a physically small resistor is sufficient to produce currents capable of severely damaging or completely destroying the MR sensor. The nature of the damage which may be experienced by an MR sensor varies significantly, including complete destruction of the sensor via melting and evaporation, contamination of the air bearing surface, generation of shorts via electrical breakdown, and milder forms of damage in which the head performance may be degraded. This type of damage has been found to occur during both processing and use and poses a serious problem in the manufacturing and handling of magnetic heads incorporating MR read sensors.

SUMMARY OF THE INVENTION

A principal object of the present invention is to minimize damage to an MR sensor caused by discharge of static electricity through or electrical overstress of the MR sensor element and other transducer components.

In view of the foregoing object, the present invention provides a thin film magnetic transducer comprising an MR read element wherein an electrical short circuit is formed in parallel with the MR read element thus providing a low-resistance, conductive path bypassing the MR sensor element and minimizing any static discharge current through the MR sensor element. According to the present invention, the MR sensor leads are shorted together to bypass the MR sensing element. Additionally, the MR leads can also be shorted to the MR head magnetic shields and/or to the slider body or the slider suspension assembly. Prior to use in a magnetic storage system, the short circuit is removed.

In a preferred embodiment, a twisted conductor pair is utilized to short the MR sensor element conductive lead terminals together during manufacture and subsequent handling of the magnetic head assembly and assembly of a magnetic storage system. When assembly is sufficiently complete, the short is opened and the twisted pair is utilized to connect the MR sensing element to external circuitry. The external circuitry can include protective devices, such as reversed diode pairs, for example, to provide a current bypass path shunting the MR element during operation in a magnetic storage system.

BRIEF DESCRIPTION OF THE DRAWING

The foregoing and other objects, features and advantages of the present invention will be apparent from the following detailed description of the preferred embodiments of the invention, reference being made to the accompanying drawing, in which like reference numerals indicate like parts and in which:

FIG. 5b is a cross-sectional view taken along line AA' of FIG. 5a;

DETAILED DESCRIPTION OF THE PREFERRED EMBODIMENTS

Figure 1:
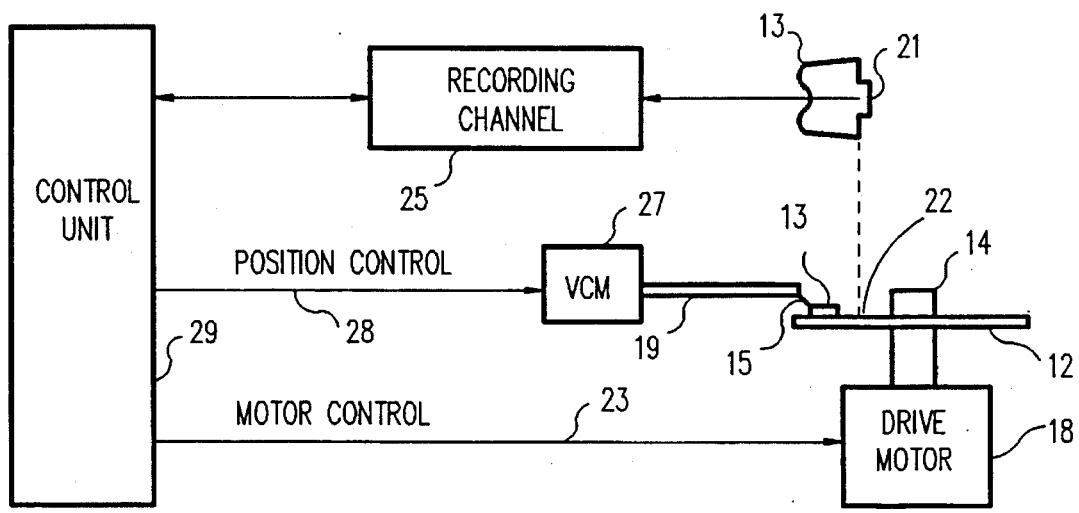
FIG. 1 is a simplified block diagram of a magnetic disk storage system embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example, or other applications in which a sensor is utilized to detect a magnetic field. A magnetic disk storage system comprises at least one rotatable magnetic disk 12 is supported on a spindle 14 and rotated by a disk drive motor 18 with at least one slider 13 positioned on the disk 12, each slider 13 supporting one or more magnetic read/write transducers 21, typically referred to as read/write heads. The magnetic recording media on each disk is in the form of an annular pattern of concentric data tracks (not shown) on disk 12. As the disks rotate, the sliders 13 are moved radially in and out over the disk surface 22 so that the heads 21 may access different portions of the disk where desired data is recorded. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force or lift on the slider. The air bearing thus counterbalances the slight spring force of the suspension 15 and supports the slider 13 off and slightly above the disk surface by a small, substantially constant spacing during operation.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of FIG. 1 are for representation purposes only. It should be apparent that disk storage systems may contain a large number of disks and actuators, and each actuator may support a number of sliders.

Figure 2A:
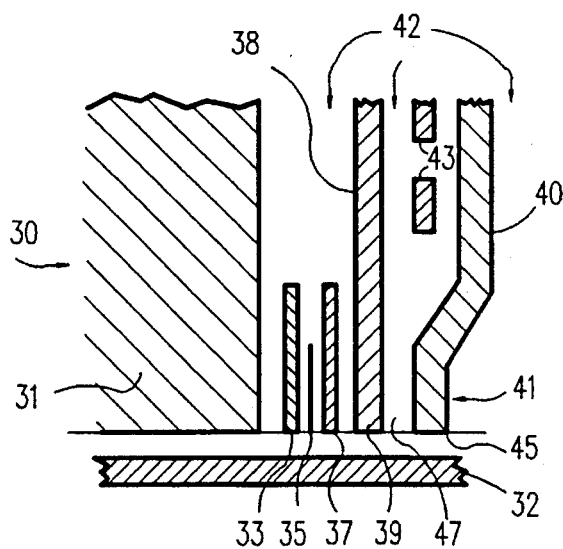
FIGS. 2a and 2b are cross-sectional views of MR read/ inductive write magnetic transducers.
Figure 2B:
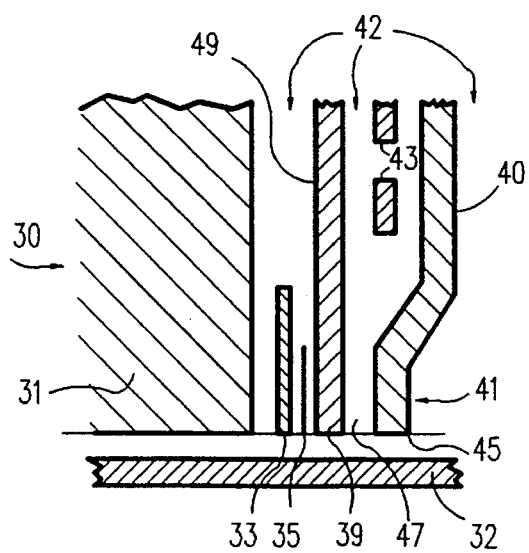

Referring now to FIGS. 2a and 2b, a portion of a MR read/inductive write magnetic head 30 is shown in transducing relationship with a rotating magnetic recording disk 32 such that the head air bearing surface 45 (ABS) is disposed in facing relationship with and slightly above the disk recording surface. Generally, such a head 30 includes an MR read assembly and an inductive write assembly formed adjacent one another on a substrate surface. The substrate surface is typically the vertical surface forming the trailing end of the slider 13 (as shown in FIG. 1) carrying the magnetic head. The MR read assembly comprises a MR sensing element 35 fabricated of a ferromagnetic material, such as a nickel-iron (NiFe) alloy, for example, which is enclosed by first and second magnetic shield elements 33 and 37, respectively. The MR sensing element can comprise a single layer of NiFe, commonly referred to as Permalloy. More typically, the MR sensing element will comprise a multilayer magnetic structure, including magnetic bias layers, of the type described in U.S. Pat. No. 4,785,366 or of the type described in U.S. Pat. No. 5,206,590, utilizing the giant MR effect. The shield elements 33 and 37 are generally made of a highly permeable magnetic material, such as Permalloy or Sendust, a trialloy of aluminum-silicon-iron. The magnetic shield elements 33 and 37 minimize or eliminate magnetic interferences from affecting the MR element 35 and thereby producing extraneous electrical pulses. Conductive leads (as shown in FIG. 4a), generally copper (Cu) or other suitable conductive material, attached electrically at the end portions of the MR element 35 couple the MR element to external circuitry to provide a means for sensing the resistance of the MR element.

The MR read assembly is formed by vacuum deposition techniques, such as sputter deposition, for example, on the substrate 31. The various elements of the MR assembly are surrounded and insulated from each other by layers 42 of insulating material, such as silicon dioxide or aluminum oxide, for example.

The inductive write assembly comprises a lower or first pole piece 38 and an upper or second pole piece 40. The first and second pole pieces 38, 40 are made of a highly permeable magnetic material such as NiFe, for example, and form a magnetic circuit magnetically connected together at a back gap portion (not shown) with the first and second pole tips 39 and 41 forming a magnetic gap 47 at the air bearing surface 45. One or more layers of electrical conductors 43, generally made of Cu, for example, form the inductive coil disposed between the first and second pole pieces 38, 40. The inductive coil 43 is also connected to external circuitry via conductive leads. The poles pieces 38, 40 and the inductive coil conductors 42 are fabricated by well-known processes such as electro-plating or sputter deposition, for example. The pole pieces are insulted electrically from the inductive coil and the MR read assembly by layers 42 of insulating material. Additionally, the entire assembly is covered with a capping layer 42 of insulating and protective material.

The head 30 shown in FIG. 2 is sometimes referred to as a "piggyback" head. An alternate configuration referred to as a "merged" head wherein the second MR magnetic shield element 37 is merged with the inductive assembly first pole piece 38 to form a single element 49 which performs both functions is shown in FIG. 2b.

As described above in the background section, static electrical charges built up on the various components of the head assembly 30 or on any object, equipment or person which may come into contact with or closely approach the head assembly or any electrical leads attached to the head assembly pose the potential for serious damage to the head. These charges are built up during the manufacturing process and during subsequent handling of the heads. For example, the assembly of the head with other components to produce a disk drive assembly can result in relatively large amounts of static electrical charge accumulating on the head elements. The electrical charges migrate from the areas at which they are generated to build up along conductive paths. Thus a buildup of static charge occurs that subsequently results in a discharge from one conductive element across a dielectric, which experiences "breakdown", to another conductive element, in the manner of a capacitive discharge. The discharge typically causes damage by burnout or the like at the areas of the conductive material which act as terminals for the discharge of the stored static electrical energy. As discussed above with reference to U.S. Pat. Nos. 4,317,149 and 4,800,454, the problems concerning electrostatic discharge (ESD) for inductive heads are well-known and the referenced patents provide methods and structure for protection of inductive heads.

While the coil conductors 43 and the magnetic pole pieces 38, 40 can withstand relatively high voltages and currents, because of its physically small cross-section, the MR sensing element is particularly sensitive to current and voltage overloads. The active sensing portion of the MR element will have a length in the range of 0.5 to 20 um, a height (width) of 0.5 to 5 um and a thickness of 10 to 100 nanometers (nm) and a resistance of about 20 to 80 ohms. In MR read assemblies of the types shown in FIGS. 2a and 2b, it has been found that such damage occurs along the sensing region of the MR element 35 when the accumulated static charge is discharged directly through the MR element 35 and may or may not include discharge to the magnetic shield elements or first pole piece or the body of the slider (substrate).

Figure 3:
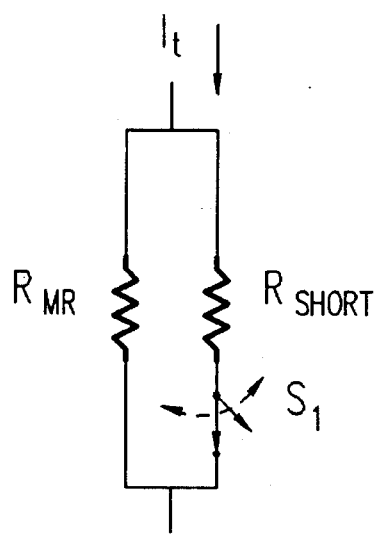
FIG. 3 is a simplified schematic diagram illustrating the protective circuitry for MR sensor elements according to the present invention.
Figure 4B:
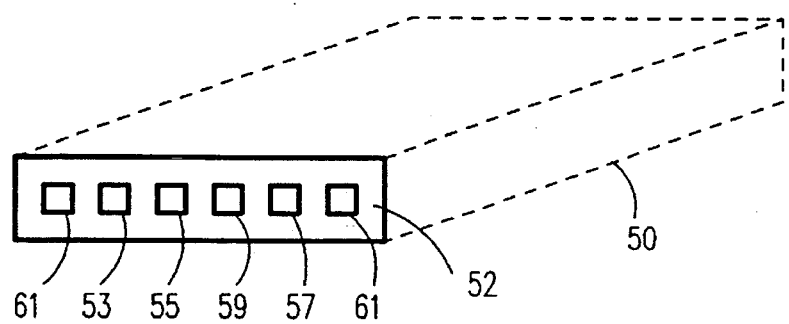
FIGS. 4a and 4b are simplified diagrams illustrating the elements of an MR head and corresponding element terminals on the trailing edge wall of a slider.
Figure 4A:
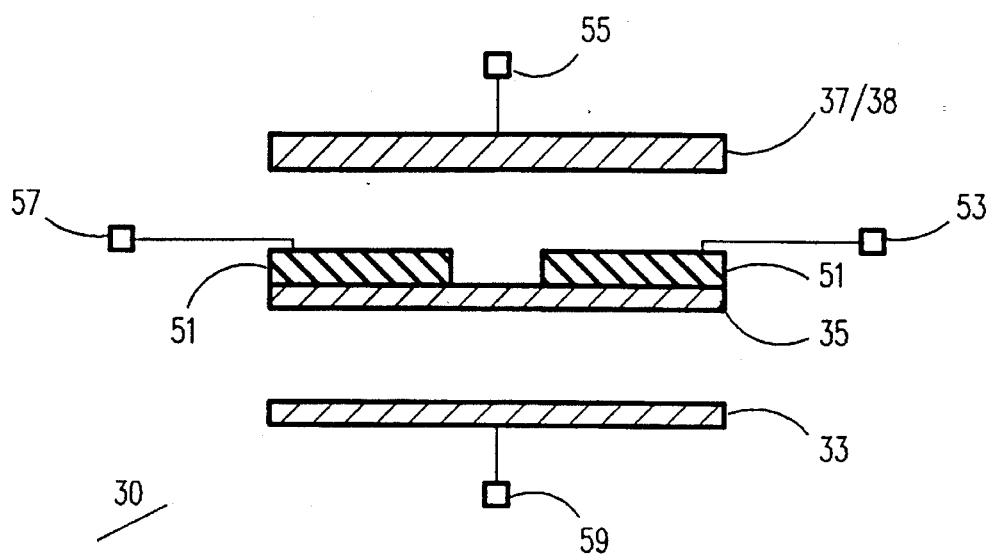

Referring now to FIGS. 3, 4a and 4b, in accordance with the present invention, electrostatic discharge and electrical overstress protection for an MR head is accomplished by shorting together the MR sensing element leads 51 to provide a short-circuit conductive discharge path which shunts any current around the MR sensing element 35. Ideally, the resistance of a short circuit is zero and no current would flow through the MR sensing element. However, in practice, a finite resistance, $R_{short}$, exists which includes, at least, the resistance of wiring and connections used to implement the short. As shown in FIG. 3, the short circuit, represented by $R_{short}$, and the MR sensing element, represented by $R_{MR}$, form a parallel circuit in which the amount of the current flow through the MR sensing element is given by:

$$I_{MR}=I_T \times R_{short}/(R_{short}+R_{MR}).$$

Thus, to minimize the current through the MR sensing element, $R_{short}$ should be as small as can practically be obtained. In general, to be effective, the upper limit for the short circuit resistance is given by:

$$R_{short} < 0.5\ R_{MR}.$$

In any practical implementation, $R_{short}$ will be much less than this upper limit.

As described above with reference to FIGS. 2a and 2b, the MR/inductive transducer or head 30 is formed in the slider 50 trailing edge with only the conductive lead terminals or pads exposed on the vertical surface 52. For example, pads 61 are connected to the inductive write coil 43 and provide electrical connections for the external write circuitry. Similarly, as shown in FIG. 4a, the elements of the MR read head are provided with pads for connection to external circuitry, the MR sensing element 35 being connected to pads 53 and 57 via conductive leads 51. According to the present invention, the MR magnetic shield elements 33 and 37 or 38 are also connected to pads 59 and 55, respectively.

The feature common to several preferred embodiments of the present invention involves electrically shorting together the two leads of the MR sensing element 35. This may be accomplished either by shorting together the leads or wires provided on the slider suspension that connect to the MR pads on the slider trailing edge, or by shorting together the MR pads directly on the slider. Increased protection can be achieved by additionally shorting the MR leads to the slider suspension, to the MR element magnetic shields, to the write coil leads or to the slider body, or to any combination of these. Additionally, the short circuit may be implemented as a switch S1 (as shown in FIG. 3) which can be "opened" at intermediate testing steps, and then "closed" again for protection during subsequent process steps. The MR leads are shorted as early as practical in the head manufacturing process to provide EOS/ESD protection for as much of the fabrication and assembly process as possible. The short is to be removed at a subsequent processing step, preferably as late as practical in the manufacturing and assembly process prior to the final customer level operating configuration.

Figure 5A:
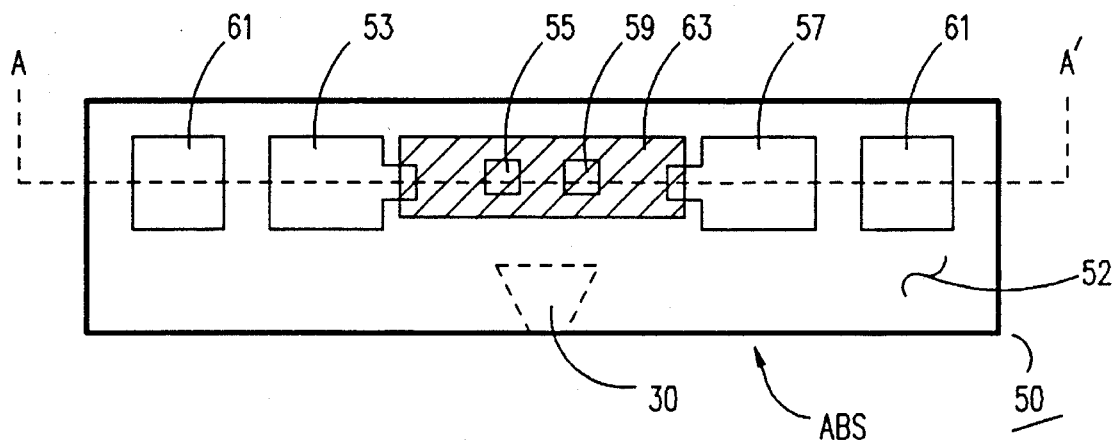
FIGS. 5a, 5c and 5d are plan views of the connective terminals for an MR head illustrating preferred embodiments of the present invention.
Figure 5B:
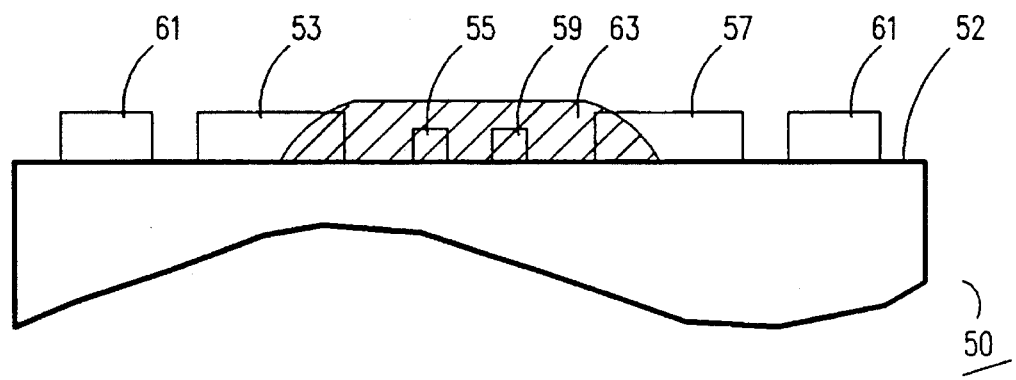
Figure 5C:
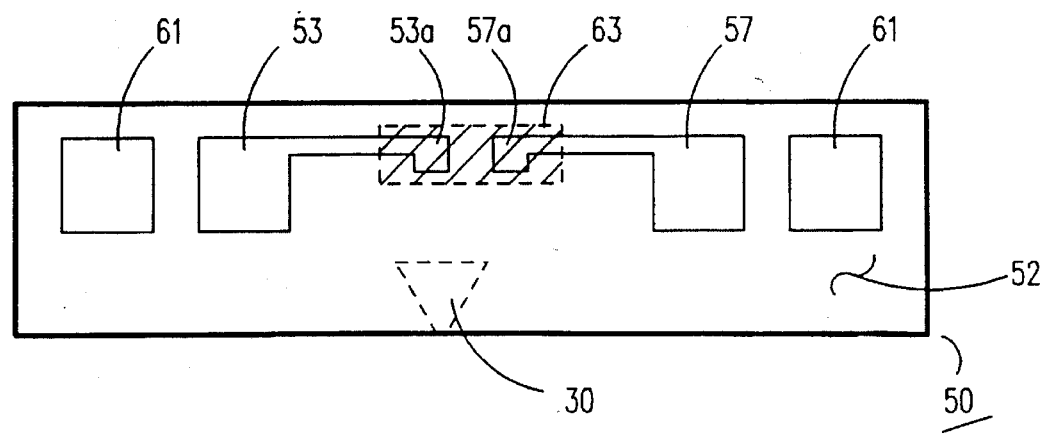
Figure 5D:
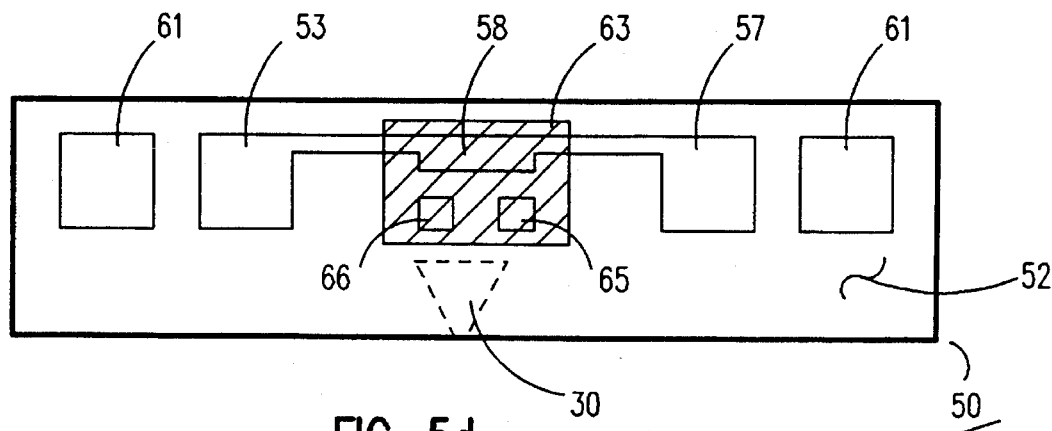
Figure 7:
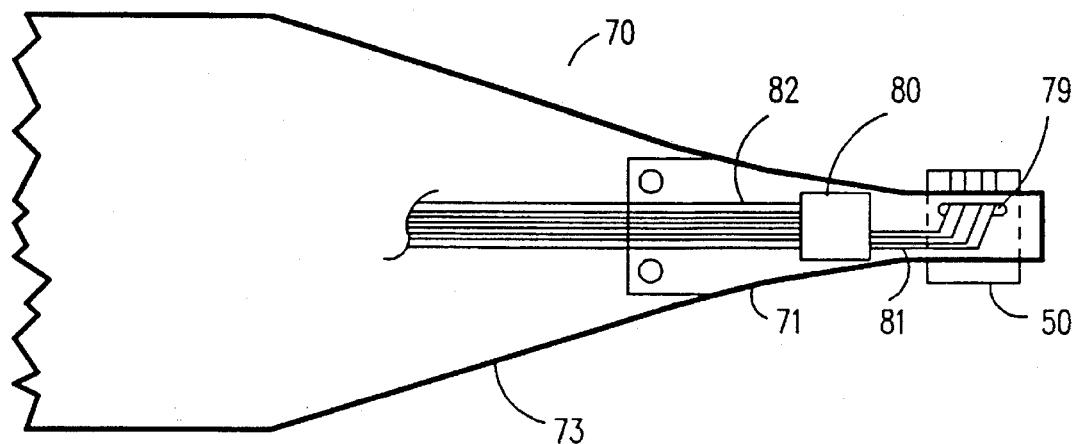
FIG. 7 is a top plan view of a head-suspension assembly illustrating another preferred embodiment of the present invention.

Referring now also to FIGS. 5a, 5b, 5c and 5d, in a preferred embodiment of the present invention, the MR sensing element pads 53 and 57 and the MR element magnetic shield element pads 55 and 59 are shorted together at the slider surface 52 such as by a shorting bridge 63. As is known in the art, the terminal pads 53, 55, 57, 59 and 61 may be of gold (Au), copper (Cu) or aluminum (Al), or other suitable high conductance material. Similarly, the terminal pads are connected to their respective inductive and MR head elements by conductive leads of Au or Cu, or other suitable high conductance material, formed by deposition or plating steps during the head fabrication process. As described above, only the two MR pads 53 and 57 can be shorted together by shorting bridge 63 at shorting tabs 53a and 57a, as shown in FIG. 5c, or all or any combination of the different pads can be shorted together. Additionally, as shown in FIG. 5d, both of the MR magnetic shield elements can be connected to a single pad 58 and an auxiliary pad 65 can be provided to allow grounding the shorted pads to the slider body 50 or to other components of the head-suspension assembly, such as the suspension load beam 73 or the flexure 71 (as shown in FIG. 7), for example. A second auxiliary pad 66 can also be provided to allow shorting of other of the read/write head elements, such as the inductive write coil leads 61, the inductive magnetic yoke structure (39, 41, as shown in FIGS. 2a and 2b) or the MR shield elements, for example.

The shorting bridge 63 shorting the terminals pads together is formed as soon as practical, preferably at the wafer level as soon as the terminal pads have been formed during the head fabrication process. The shorting bridge 63 can be formed during the fabrication process using well-known deposition or plating techniques or can, alternatively, be formed using conventional soldering techniques. Any suitable high conductance material, such as Au, Cu or an alloy of lead-tin, for example, can be used for the shorting bridge 63 material. The shorting bridge material can be in the form of a solder ball or solder pad, or an electrically conductive film of conductive polymers or other suitable conductive material. The conductive thin film can be formed by well-known vacuum deposition techniques such as RF or ion beam sputter deposition techniques, for example. As described above, the shorting bridge 63 must be removed prior to the head being put into operation in a magnetic storage system. For example, the shorting bridge 63 can be removed after the head/slider has been attached to a suspension assemble. The solder bridge can be removed by any of several well-known techniques such as laser ablation, chemical etching or ion milling, for example, as described in more detail with reference to FIG. 8c below.

Figure 6A:
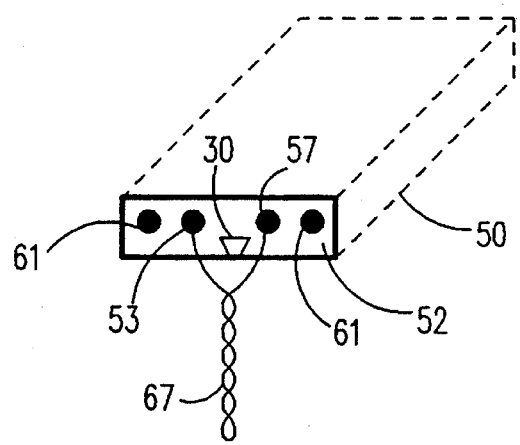
FIGS. 6a, 6b and 6c are schematic diagrams illustrating another preferred embodiment according to the present invention.
Figure 6B:
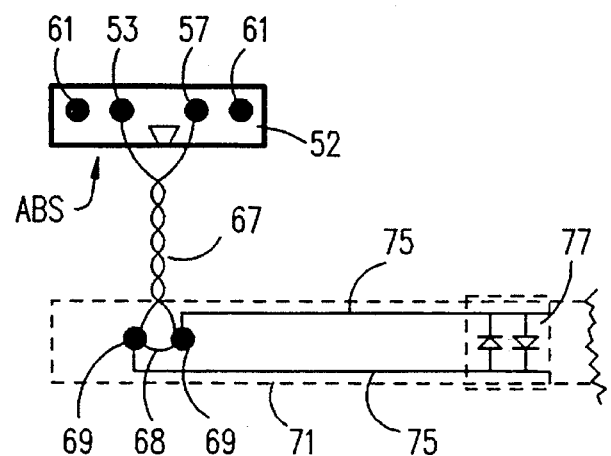
Figure 6C:
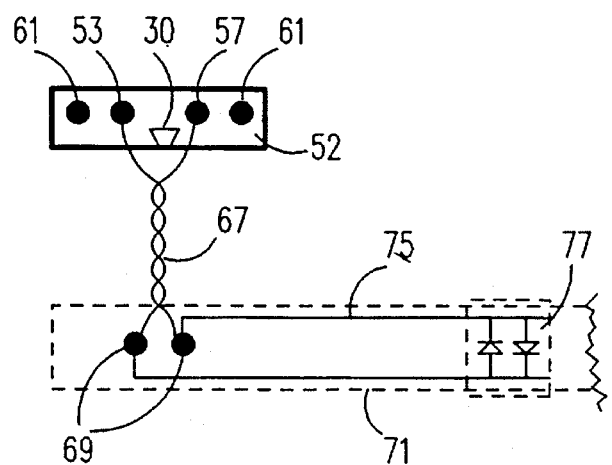

Referring now to FIGS. 6a, 6b and 6c, another preferred embodiment according to the present invention comprises the use of a twisted conductor pair to short the MR sensor element conductor lead terminals together during manufacture and subsequent handling of the magnetic head assembly and assembly of a disk drive. At a desired point in the assembly process, the short is opened and the twisted pair is utilized to connect the MR sensing element to external circuitry. Additionally, protective devices external to the magnetic head assembly can be connected across the circuit leads to provide a bypass current path shunting the MR element during disk drive operation. FIG. 6a shows a slider 50 having a magnetic head assembly 130 formed on the vertical surface 52 of its trailing edge. The magnetic head assembly 30 is covered with a protective coating, as described herein above with the conductor leads for the MR element and inductive coil extended out to connector terminal pad pairs 53, 57 and 61, respectively. A conductor forming a shorted, twisted pair 67 is connected to the MR lead terminals 53, 57 thus providing a short circuit across the MR element. Any electrostatic discharge of charge built up on the MR element or its leads will be shunted around the MR element. During assembly of the head-disk-assembly (HDA), the slider 50 is physical attached to a support arm or flexure 71, as shown in FIGS. 6b, 6c and 7, with the twisted pair 67 being used to connect the MR element terminal pads 53, 57 to external circuitry leads 75 at terminals 69. After the twisted pair 67 is connected to the terminals 69, the terminals can be shorted by a conductor 68 to maintain the MR leads in a shorted condition as long as practical during the HDA assembly process. Non-linear variable resistance protective devices 77, such as a pair of P-N junction diodes or Schottky diodes, are connected across the leads 75 to provide a bypass path to protect the MR element against voltage/current surges, for example, during normal operation of the HDA. Removal of the short 68 between the terminals 69 then connects the protective devices 77 across the MR element leads. The protective devices 77 may be mounted directly on the support arm 71 or, alternatively, integrated with other circuitry on a chip or circuit board, such as an arm electronics module chip, for example. At a selected point in the HDA assembly process, prior to the sealing of the HDA in its housing, the twisted pair 67 is opened between the lead terminals 69 to remove the short from across the MR element. The external diodes 77 then provide protection during the operational lifetime of the magnetic head assembly.

Referring now also to FIGS. 7, 8a, 8b, and 8c, FIG. 7 illustrates a conventional head-suspension assembly (HSA) wherein the head/slider 50 is mechanically attached to the flexure 71, the flexure in turn being attached to the suspension load beam 73. Electrical connection between the magnetic head and a magnetic storage system or other external circuitry is made by conductive leads formed in a flex cable 82 as is well-known in the art. As described above with reference to FIGS. 6b and 6c, protective devices provided in an arm electronics module or other remote circuitry can also be connected across the MR head elements via flex cable 82. The flex cable 82 is connected to a terminal assembly 80 which provides for electrical connection between the magnetic head 50 and the flex cable 82 via conductor leads 81. As will be understood, the flex cable terminal assembly 80 is typically in close proximity to the magnetic head and is shown here widely separated from the head for illustrative purposes only. Alternately, the suspension can be of the type described in U.S. Pat. Nos. 4,761,699 or 4,996,623 comprising a composite or laminated structure having a base layer with patterned electrical leads formed thereon and an insulating cover layer.

Figure 8C:
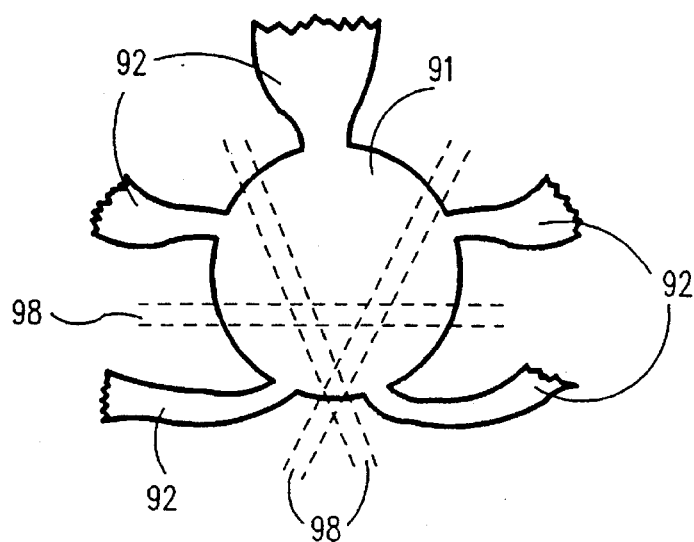
FIG. 8c is an enlarged view of the shorting element shown in FIGS. 8A and 8b illustrating the removal thereof.
Figure 8A:
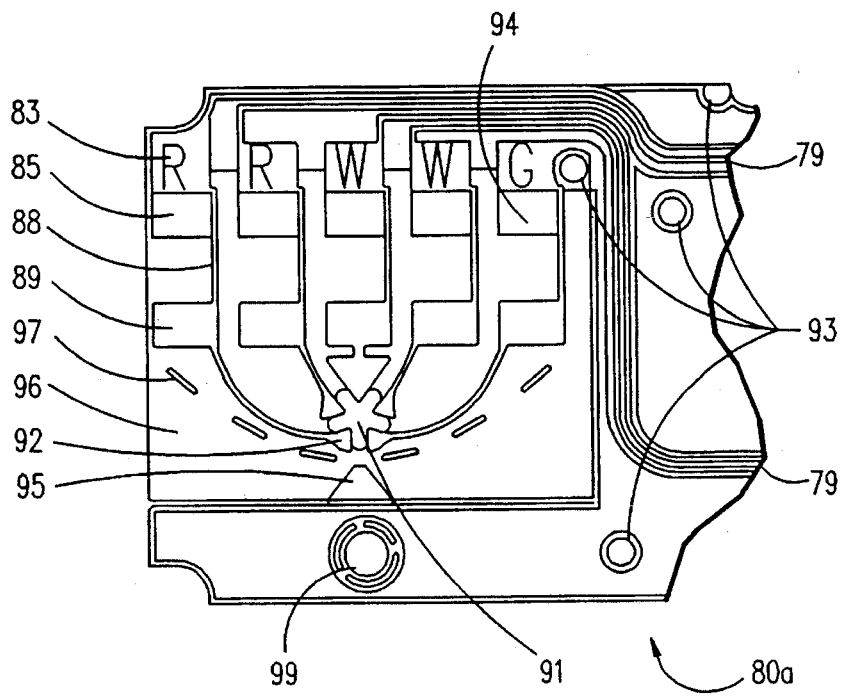
FIGS. 8a, 8b and 8d are schematic diagrams illustrating in more detail various implementations of the preferred embodiment shown in FIG. 7.
Figure 8B:
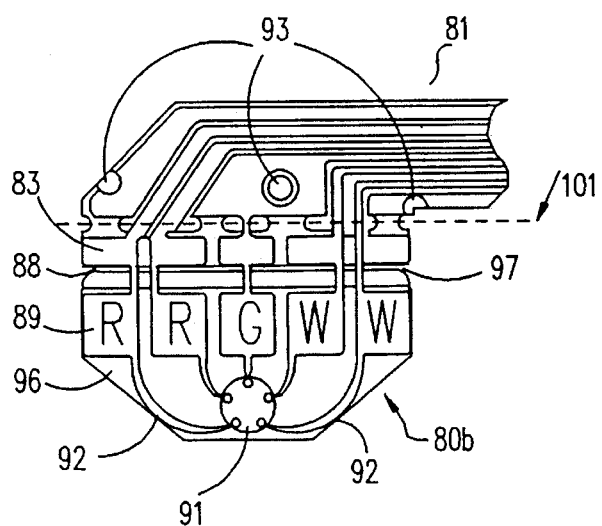

FIGS. 8a, 8b, 8c and 8d illustrate three preferred embodiments of the terminal assembly 80 according to the present invention. The three embodiments shown can be incorporated in a planar suspension comprising a three-layer lamination of copper, polyimide and stainless steel or in a more conventional suspension assembly as shown in FIG. 7. The embodiment shown in FIG. 8a is designed primarily for use in a stacked actuator wherein the flex cable 82 for each of the suspension arms is terminated with a 90 degree solder fillet. The embodiments shown in FIGS. 8b and 8c are generally suitable for use in any actuator configuration including stacked actuator configurations.

With continuing reference to FIG. 8a, the terminal assembly 80a comprises termination pads 83 electrically connected to the head MR and inductive element pads by conductors 81. The flex cable 82 conductors are connected to the termination pads 83 by soldering or other suitable method to connect the head to external circuitry. The termination pads are connected to test pads 89 by conductors 88. The test pads 89 allow testing and probing of the circuit without marring the termination pads 83 and inhibiting a reliable termination joint to the flex cable 82. The test pads include extension tabs 92 to form an ESD protect junction where all of the termination pads 83 including a ground pad 94 are brought together in a pattern that allows for the placement and removal of a liquified solder ball 91 thus shorting together all of the MR/inductive head elements and also grounding the head elements. Grounding points 93 provide an electrical path to ground from ground pad 93 and the termination assembly 80 and flex cable 82 guard lines (noise shielding) to the stainless steel layer in the planar laminated suspension or to the suspension flexure.

The terminal assembly 80a as shown in FIG. 8a is formed of a laminated layer of flexible polyimide material with the various conductors and pads formed of Cu or other suitable material embedded in the polyimide layer as is known in the art. The test pads 89 and ESD protect junction are formed on a flap 96 which can be bent and folded back to allow for the required clearance between suspension assemblies in a stacked actuator. A solder tack area 99 aligns with the ESD protect junction of an adjacent suspension assembly when its flap 96 is folded over. The solder balls 91 at the ESD protect junctions of the opposing suspensions can be reflowed to the opposing solder tack areas 99 to connect both suspension assemblies to the same or a common ground. Terminations to the flex cable 82 can be made through windows 85 formed through the polyimide layer adjacent to the termination pads 83. A holding tab 95 is provided to temporarily maintain in place the flap containing the test pads 89 and the ESD protect junction. The holding tab 95 also functions as a point for holding the flap 96 when folding it over to provide clearance for the stacking the actuator assembly. Perforations 97 are provided for removal of excess flap material. The windows 85 also form a perforation that allows for removal of the flap 96 when it is desired to remove the short circuit between the head elements.

With continuing reference to FIG. 8*b*, the terminal assembly 80*b* comprises termination pads 83 electrically connected to the head MR and inductive element pads by conductors 81. The flex cable 82 conductors are connected to the termination pads 83 by soldering or other suitable method to connect the head to external circuitry. The termination pads are connected to test pads 89 by conductors 88. The test pads 89 allow testing and probing of the circuit without marring the termination pads 83 and inhibiting a reliable termination joint to the flex cable 82. The test pads include extension tabs 92 form an ESD protect junction where all of the termination pads 83 including a ground pad 94 are brought together in a pattern that allows for the placement and removal of a liquified solder ball 91 thus shorting together all of the MR/inductive head elements and also grounding the head elements. Grounding points 93 provide an electrical path to ground from the termination assembly 80 and flex cable 82 guard lines (noise shielding) to the stainless steel layer in the planar laminated suspension or to the suspension flexure.

As described above with reference to FIG. 8*a*, the terminal assembly 80*b* is formed of a laminated layer of flexible polyimide material with the various conductors and pads formed of Cu or other suitable material embedded in the polyimide layer as is known in the art. The test pads 89 and ESD protect junction are formed on a flap 96 which can be bent and folded along a bend line 101 to align with a flex cable 82 which terminates on the edge of the suspension assembly. Perforations 97 allow the test pads 89 and the ESD protect junction on flap 96 to be removed after the flex cable 82 is connected to the termination pads 83 and it is desired to remove the short circuit between the head elements.

With continuing reference to FIG. 8*c*, an enlarged view of the ESD protect junction formed by extension tabs, or leads, 92 and solder ball 91 is shown. As described above, the extension tabs 92 are brought together to form a junction and are shorted to each other by the placement of a solder ball 91 or other conductive film or pad to short all of the MR/inductive head elements together and to a ground reference. The preferred embodiments described with reference to FIGS. 8*a* and 8*b* provide perforations to allow removal of the shorted junction. Alternatively, the short circuit formed between the various extension tabs 92 can be removed by other methods, such as laser ablation or scribing, chemical or sputter etching, ion milling, for example, or by other suitable processes such as sand blasting, for example. Using laser ablation, for example, a series of scribe lines or cuts 98 formed through the solder ball 91 are sufficient to completely open the short circuit between the extension tabs 92.

Figure 8D:
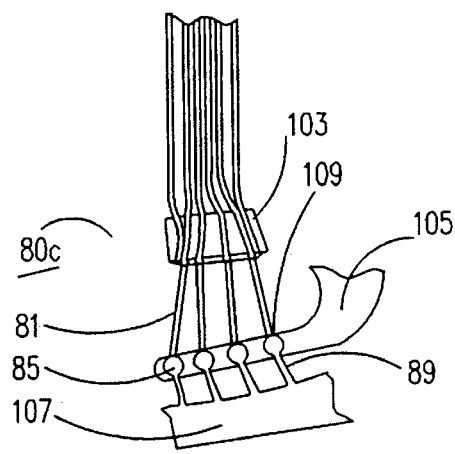

With continuing reference to FIG. 8*d*, another preferred embodiment of the terminal assembly 80 is shown. Terminal assembly 80*c* comprises a set of termination leads 81 which are connected to the MR/inductive element pads at the slider and terminate in test pads 89. The termination leads 81 overlap the corresponding flex cable 82 conductors. Both the flex cable conductors and the termination leads 81 can be pre-tinned with solder to allow a solder reflow connection to be obtained. Alternatively, the termination leads 81 and the flex cable conductors can be gold plated to allow an ultrasonic gold-to-gold joint to be obtained. Each of the test pads 83 are connected to a shorting shunt 107 by conductors 89. The shorting shunt 107 shorts the MR and inductive head elements together to provide EOS/ESD protection.

While the terminal assemblies 80*a* and 80*b* shown in FIGS. 8*a* and 8*b* are formed as integral components of a laminated planar suspension, the terminal assembly 80*c* may be formed as a flex cable or may merely be bundled conductors or wires coupling the head elements to a flex cable. Thus it may be required to provide a support structure 103 to relieve any strain in the conductors where they are attached to the suspension flexure. Similarly, a test pad support structure 105 is provided for formation of the test pads 85. Perforations 109 formed in each of the termination leads 83 immediately adjacent to the test pads 85 allow the shorting shunt 107 and the test pads 85 to be removed by twisting the test pad support structure 105 up and out of the plane of the terminal assemble 80*c*. The shorting shunt 107 is removed after the termination leads 83 have been connected to the flex cable conductors and when it is desired to open the short circuit between the head elements.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. A method for protecting a magnetoresistive sensor element in a magnetic head assembly from damage caused by electrostatic discharge during fabrication of said magnetic head assembly and subsequent handling and assembly of said magnetic head assembly in a magnetic storage system, said method comprising the steps of:

electrically connecting said magnetoresistive sensor element conductive leads together for providing a short circuit path shunting said magnetoresistive sensor element;

electrically connecting said magnetoresistive sensor element to external circuitry, said external circuitry comprising at least one protective device being electrically connected for providing a current bypass path for said magnetoresistive sensor element, said protective device shorted by said short circuit path; and opening said short circuit path in parallel with said magnetoresistive sensor element at a desired process or assembly step prior to the completion of said subsequent handling of and assembly of said magnetic head assembly in a magnetic storage system.

2. The method of claim 1 wherein said magnetoresistive sensor element conductive leads are electrically connected together by a twisted pair of conductors.

3. The method of claim 1 wherein the step of opening said short circuit path includes connecting said protective device in parallel with said magnetoresistive sensor element.

4. The method of claim 3 wherein said protective device comprises a pair of diodes oppositely connected in parallel with each other.

5. The method of claim 1 wherein the step of electrically connecting said magnetoresistive sensor element to external circuitry includes the steps of:

electrically connecting each of said magnetoresistive sensor element conductive leads to an associated one of at least two external terminals, respectively, said magnetoresistive sensor element conductive leads connected to said external terminals with a twisted pair of conductors, said protective device electrically connected to said external terminals; and electrically connecting said external terminals to together to provide an electrical short circuit between said external terminals.

6. The method of claim 5 wherein said external terminals are formed on a head assembly suspension means, said protective device mounted on said suspension means.

7. The method of claim 6 wherein said protective device forms at least a portion of an electronic circuit mounted in an arm electronics module.

8. A magnetoresistive head assembly for subsequent assembly with other components in a magnetic storage system, comprising:

a magnetoresistive sensor element; and conductor means connecting each end of said magnetoresistive sensor element together for providing a low resistance conductive path bypassing said magnetoresistive sensor element for discharging static electrical charge, said conductor means being removed thereby opening said low resistance conductive path at a desired processor assembly step prior to completion of said subsequent assembly in a magnetic storage system.

9. The magnetoresistive head assembly as in claim 8 further comprising at least one magnetic shield element, said conductor means connected to said magnetic shield element.

10. The magnetoresistive head assembly as in claim 8 wherein said conductor means is further connected to a ground reference.

11. The magnetoresistive head assembly as in claim 10 further comprising a slider, said ground reference comprising said slider.

12. The magnetoresistive head assembly as in claim 8 further comprising switch means for opening said low resistance conductive path.

13. A magnetic storage system comprising:

a magnetic storage medium having a plurality of tracks for recording of data;

a magnetic transducer maintained in a closely spaced position relative to said magnetic storage medium during relative motion between said magnetic transducer and said magnetic storage medium, said magnetic transducer including a magnetoresistive sensor formed on a substrate comprising:

a magnetoresistive sensor element; and conductor means connecting each end of said magnetoresistive sensor element together for providing a low resistance conductive path bypassing said magnetoresistive sensor element during discharge of static electrical charge;

a switch for opening said low resistance conductive path at desired process and assembly steps during manufacture and assembly of said magnetic storage system, said switch opened at a desired step prior to completion of the manufacture and assembly of said magnetic storage system;

actuator means coupled to said magnetoresistive sensor for moving said magnetic transducer to selected tracks on said magnetic storage medium; and means coupled to said magnetoresistive sensor for detecting resistance changes in said magnetoresistive sensor element responsive to magnetic fields representative of data bits recorded in said magnetic storage medium intercepted by said magnetoresistive sensor.

14. A magnetic storage system as in claim 13 wherein said conductor means includes a twisted pair of conductors.

15. A magnetic storage system as in claim 14 wherein said actuator means includes suspension means, said twisted pair of conductors electrically connecting each end of said magnetoresistive sensor to one of at least two terminals, respectively, formed on said suspension means, said terminals shorted together for providing said low resistance conductive path.

16. A magnetic storage system as in claim 15 further including protective means electrically connected across said terminals, said protective means for providing a variable resistance bypass path shunting said magnetoresistive sensor element when the short between said terminals is open.

17. A magnetic storage system as in claim 16 wherein said protective means comprises a pair of diodes oppositely connected in parallel with each other.

18. A magnetic storage system as in claim 16 wherein said protective means is mounted on said actuator means.

19. A magnetic storage system as in claim 16 wherein said protective means forms at least a portion of an electronic circuit mounted in an arm electronics module.

20. A method for providing electrostatic discharge protection for a magnetoresistive sensor during fabrication of said magnetoresistive sensor and subsequent handling of and assembly of said magnetoresistive sensor in a magnetic storage system, comprising the steps of:

electrically connecting conductor means between the lead terminals of the magnetoresistive sensor element of said magnetoresistive sensor for providing a low resistance conductive path bypassing said magnetoresistive sensor element during discharge of static electric charge; and opening said conductor means at a desired process or assembly step prior to the completion of said subsequent handling of and assembly of said magnetoresistive sensor in a magnetic storage system.

21. In a magnetic data transducer and air bearing slider assembly for subsequent assembly in a magnetic storage system, said transducer including at least one magnetoresistive read element and carried on an end surface of said slider, said magnetoresistive read element and other transducer elements having conductive lead terminals formed on an exposed surface of said slider, a method for providing electrostatic discharge protection, comprising the steps of forming an electrically conductive film on said exposed surface electrically connecting together at least the conductive lead terminals for said magnetoresistive read element, and removing at least a portion of said electrically conductive film thereby opening the electrical connection between said conductive leads for said magnetoresistive read element at a selected time prior to the final assembly of said transducer and air bearing slider assembly in a magnetic storage system.

22. The method of claim 21 wherein said electrically conductive film is formed of a material selected from the group consisting of gold, silver, aluminum and alloys of tin and lead.

23. The method of claim 21 wherein the step of removing at least a portion of said electrically conductive films comprises removing said portion of said electrically conductive film by laser ablation.

24. The method of claim 21 further including the step of electrically connecting said conductive film to a ground reference.

25. The method of claim 21 wherein the step of forming said electrically conductive film comprises soldering said conductive lead terminals together.

26. The method of claim 25 wherein said conductive lead terminals formed on said exposed surface includes a ground terminal, the conductive lead terminals for said transducer elements electrically connected to said ground terminal by said electrically conductive film.

27. The method of claim 21 wherein said electrically conductive film is formed by sputter deposition.

28. In a magnetic data transducer, slider and suspension assembly for subsequent assembly in magnetic storage systems, said transducer including at least one magnetoresistive read element and one inductive write element, said magnetoresistive read element and other transducer elements having conductive lead connection pads formed on an exposed surface of said slider, a flex cable for electrically coupling said magnetic data transducer to external circuitry, said flex cable comprising:

a plurality of conductors, each conductor electrically connected to a conductive lead connection pad, respectively, for an associated transducer element for coupling said transducer elements to said external circuitry; and shorting means electrically connected to said plurality of conductors shorting said plurality of conductors together for electrically shorting together all of said transducer elements, said shorting means being removed at a desired time prior to completion of manufacture and assembly of said transducer, slider and suspension assembly in a magnetic storage system.

29. A flex cable as in claim 28 wherein said transducer further includes a ground connection pad formed on said exposed surface of said slider, said flex cable including a ground conductor electrically connected to said ground connection pad for providing a ground connection for the transducer elements.

30. A flex cable as in claim 28 further comprising a plurality of electrically conductive test pads, one test pad connected to each of said plurality of conductors, each said test pad having a conductive tab extending therefrom to a junction region, said shorting means electrically connecting said tabs together at said junction region.

31. A flex cable as in claim 30 wherein said shorting means comprises a film of conductive material electrically connecting said tabs together.

32. A flex cable as in claim 31 wherein said conductive film comprises a copper film.

33. A flex cable as in claim 30 wherein said shorting means comprises a solder ball.

34. A flex cable as in claim 30 further comprising a laminated layer of flexible polyimide having said plurality of conductors embedded therein.

35. A flex cable as in claim 28 further including a terminal assembly, each of said plurality of conductors connected to termination pads formed on said terminal assembly, respectively, each of said termination pads being connected to an associated transducer element connection pad via a termination lead, shorting tabs extending from each termination tab to a junction region on said terminal assembly, said shorting means electrically connecting said tabs together at said junction region.

36. A flex cable as in claim 35 wherein each said shorting tab includes a perforated region extending transversely thereto for allowing the shorting tab to be opened and the shorting means to be removed.

37. A flex cable as in claim 35 wherein said shorting means comprises a film of conductive material electrically connecting said shorting tabs together in the junction region, said film adapted to be electrically opened by laser ablation.

* * * * *